US010725595B2

(12) United States Patent
Schooley et al.

(10) Patent No.: US 10,725,595 B2
(45) Date of Patent: Jul. 28, 2020

(54) ELECTRONIC DEVICES WITH COVERS (71) Applicant: Apple Inc., Cupertino, CA (US)

(72) Inventors: Stephen T. Schooley, Menlo Park, CA (US); Kendall L. Helbert, San Francisco, CA (US); Ari Y. Benbasat, San Jose, CA (US); Clayton J. McCoy, San Francisco, CA (US); Devon J. Rosner, Mountain View, CA (US); Joshua A. Hoover, Saratoga, CA (US); Sean M. Cole, San Jose, CA (US); Yufei Zhao, Cupertino, CA (US); Zhao Liu, Santa Clara, CA (US); Judd Reed, Santa Rosa, CA (US)

(73) Assignee: Apple Inc., Cupertino, CA (US)

( * ) Notice: Subject to any disclaimer, the term of this patent is extended or adjusted under 35 U.S.C. 154(b) by 122 days.

(21) Appl. No.: 15/961,742

(22) Filed: Apr. 24, 2018

(65) Prior Publication Data
US 2019/0324574 A1 Oct. 24, 2019

(51) Int. Cl.
G06F 3/045 (2006.01)
G06F 3/044 (2006.01)
G06F 3/041 (2006.01)
H05K 5/03 (2006.01)

(52) U.S. Cl.
CPC ............ *G06F 3/044* (2013.01); *G06F 3/0412* (2013.01); *H05K 5/03* (2013.01)

(58) Field of Classification Search
CPC ...... G06F 3/0412; G06F 3/0414; G06F 3/042; G06F 3/0421; G06F 3/044
See application file for complete search history.

(56) References Cited

U.S. PATENT DOCUMENTS

| 9,001,082 | B1 | 4/2015 | Rosenberg et al. |
| 9,600,034 | B2 | 3/2017 | Kiple et al. |
| 9,715,254 | B2* | 7/2017 | Mori ...................... G06F 1/1628 |
| 9,885,763 | B2* | 2/2018 | Lee ......................... G01R 33/07 |
| 2014/0139989 | A1 | 5/2014 | Mori et al. |
| 2014/0298062 | A1 | 10/2014 | Lee |
| 2015/0212588 | A1 | 7/2015 | Fujioka |
| 2016/0196936 | A1 | 7/2016 | Ding et al. |

* cited by examiner

Primary Examiner — Vijay Shankar
(74) Attorney, Agent, or Firm — Treyz Law Group, P.C.; G. Victor Treyz; Kendall W. Abbasi (57) ABSTRACT An electronic device such as a portable electronic device may have display with a capacitive touch sensor. A cover may have a front portion and a rear portion that bend along a bend axis. The front portion may overlap the display when the cover is closed. Conductive structures such as a patterned conductive layer having elongated strips of conductive material separated by gaps or another predetermined pattern may be formed in the front portion of a cover or other portion of a cover that overlaps the display and capacitive touch sensor when the cover is closed. Control circuitry in the device can gather capacitance images with the touch sensor and can detect when the cover has transitioned from open to closed or from closed to open from whether the predetermined pattern becomes present or becomes absent in the capacitance images.

22 Claims, 11 Drawing Sheets

FIG. 12

ELECTRONIC DEVICES WITH COVERS

FIELD

This relates generally to electronic devices, and, more particularly, to electronic devices with covers.

BACKGROUND

Electronic devices such as tablet computers include displays. A cover may be used to help protect a display in a tablet computer from damage. A magnet may be placed in a flexible cover and a corresponding magnetic sensor such as a Hall effect sensor may be provided in a tablet computer. During operation, the tablet computer can use the magnetic sensor to determine whether the magnet is present and therefore determine whether or not the flexible cover is open or closed. In response to determining the state of the cover, the tablet computer can take actions such as placing the device in a sleep state when the cover is present or awakening the device from the sleep state when the cover is not present.

Magnetic field interference from magnets in covers may give rise to challenges for sensitive components such as compass sensors and cameras. Covers may also fail to offer users desired functionality.

SUMMARY

An electronic device such as a portable electronic device may have a touch sensor. The touch sensor may be a capacitive touch sensor in a display. A cover may be provided for the electronic device. The cover may have one or more hinge areas that allow portions of the cover to rotate relative to each other.

A cover may have a front portion and a rear portion that bend along a bend axis. The front portion may lie in a common plane with the rear portion when the cover is open and may overlap the display when the cover is closed. A conductive structure such as a patterned conductive layer having elongated strips of conductive material separated by gaps may be formed in the front portion of a cover or other portion of a cover that overlaps the capacitive touch sensor when the cover is closed.

Control circuitry in the device can gather capacitance images with the touch sensor and can detect when the cover has transitioned from open to closed or from closed to open from whether the predetermined pattern becomes present or becomes absent in the capacitance images. Suitable actions such as transitioning between a wake state and a sleep state may be taken based on cover transitions.

If desired, touch sensors and other components may be incorporated into the cover. These components may be used to provide enhanced input to the electronic device. The electronic device can gather information from the components by monitoring the touch sensor, using magnetic sensor measurements or other sensor measurements, using wired and/or wireless communications, using a capacitively coupled or physically connected data path, and/or using other signaling arrangements.

In some configurations, the cover may include one or more magnets that are sensed by one or more magnetic sensors in the electronic device or other electronic device may use a proximity sensor to monitor whether the cover is closed or open. These measurements may be used, for example, to confirm whether the cover has in fact made a suspected transition in state before action is taken.

DETAILED DESCRIPTION

Figure 1:
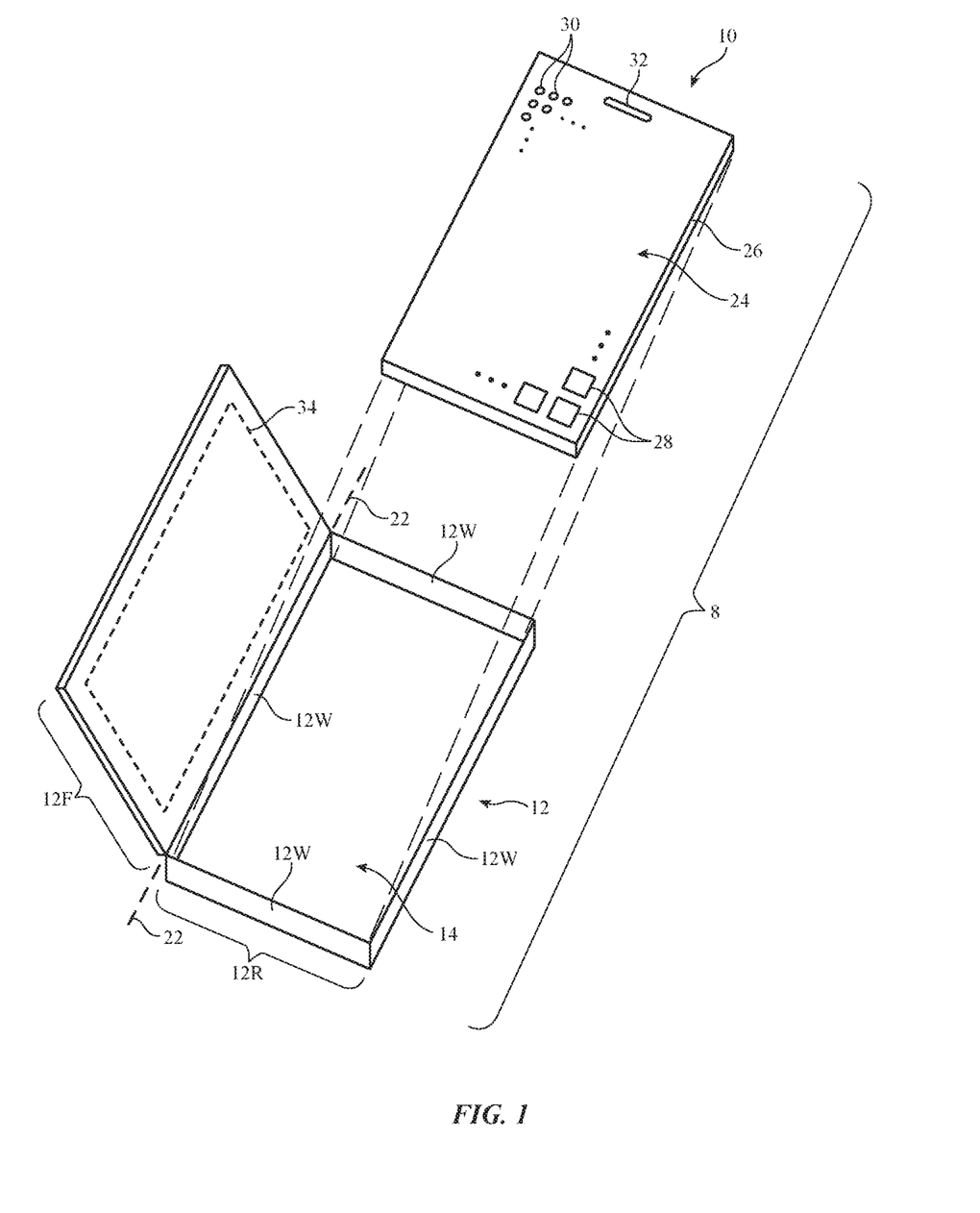
FIG. 1 is a perspective view of an illustrative electronic device and associated cover in accordance with an embodiment.

Electronic devices may be provided with protective covers (sometimes referred to as cases or enclosures). An illustrative system that includes an electronic device and an associated cover is shown in FIG. 1. As shown in FIG. 1, system 8 may include electronic device 10 and removable cover 12. Electronic device 10 may be a portable electronic device. Cover 12 may have any suitable shape that allows cover 12 to mate with electronic device 10. In the example of FIG. 1, cover 12 has a folio shape (sometimes referred to as a folio cover) with a rear portion 12R and front portion 12F. Rear portion 12R may have a rectangular recess 14 surrounded by peripheral sidewalls 12W or other suitable structures (straps, clips, a sleeve, corner pockets, etc.) that allow cover 12 to receive and couple to device 10.

The portion of cover 12 that extends along fold axis 22 between rear portion 12R and front portion 12F may have hinge structures (e.g., flexible cover material that serves as a hinge or other hinge structures that couple portions 12F and 12R while allowing these portions to rotate relative to each other). In some configurations, additional bendable portions may be provided (e.g., one or more strips of cover portion 12F parallel to axis 22 may be flexible to allow additional folds to be formed in cover 12).

Electronic device 10 may be a tablet computer, a cellular telephone, a media player, or other handheld or portable electronic device, a laptop computer, a smaller device such as a wrist-watch device, or other electronic equipment. In the illustrative configuration of FIG. 1, device 10 is a portable device such as a cellular telephone or tablet computer having a display such as display 24 mounted in a housing such as housing 26.

Housing 26, which may sometimes be referred to as an enclosure or case, may be formed of plastic, glass, ceramics, fiber composites, fabric, metal (e.g., stainless steel, aluminum, etc.), other suitable materials, or a combination of any two or more of these materials. Housing 26 may be formed using a unibody configuration in which some or all of housing 26 is machined or molded as a single structure or may be formed using multiple structures (e.g., an internal frame structure, one or more structures that form exterior housing surfaces, etc.).

Display 24 may be a touch screen display that incorporates a layer of conductive capacitive touch sensor electrodes. Capacitive touch screen electrodes 28 may extend across the surface of display 24 to gather touch input from a user's fingers or other external objects. Capacitive touch screen electrodes 28 may be formed from an array of indium tin oxide pads, overlapping horizontal and vertical strips of indium tin oxide, indium tin oxide or other conductive material patterned in diamond shapes, or other transparent conductive structures (as examples). In some arrangements, thin-film metal traces on a display substrate may be used in forming touch sensor electrodes 28.

Display 24 may include an array of pixels 30. The array of pixels 30 in display 24 may form an active area such as a rectangular active area. Device 10 may have opposing front and rear faces. Pixels 30 may be formed on the front face of device 10 and may be used in displaying images for a user. Display 24 may be a liquid crystal display, an organic light-emitting diode display, or other suitable display. Display 24 may be protected using a display cover layer such as a layer of transparent glass or clear plastic. Openings may be formed in the display cover layer. For example, an opening may be formed in the display cover layer to accommodate a button, a speaker port (see, e.g., optional speaker port opening 32), or other component. If desired, openings may be formed in housing 26 to form communications ports (e.g., an audio jack port, a digital data port, etc.), to form openings for buttons, etc.

When it is desired to protect device 10 in cover 12, housing 26 may be press fit into recess 14, coupled to cover 12 using magnets, clips, or straps, or otherwise coupled to cover 12. Cover 12 may, if desired, have a credit card pocket such as pocket 34 on front portion 12F. Cover 12 may be formed from fabric, leather, polymer, other materials, and/or combinations of these materials.

A touch sensor that extends across the surface of display 24 may be formed using transparent capacitive touch sensor electrodes 28 that overlap pixels 30 and/or other capacitive touch sensor electrodes. Electrodes 28 may have any suitable shapes (e.g., squares, rectangles, elongated strips, lines, diamonds, and/or other shapes). In some configurations, electrodes 28 may be formed from transparent conductive material that overlaps pixels 30 (e.g., on a touch panel layer that is separate from the layers of display 24 that form pixels 30). Electrodes 28 may also be formed from metal traces on a display panel (e.g., metal lines that are formed on a common substrate with pixels 30). Other capacitive touch sensor arrangements for forming the touch sensor for display 24 may be used, if desired. Touch sensor control circuitry (e.g., one or more touch sensor integrated circuits) may be used to provide drive signals to capacitive sensor electrodes (e.g., in rows or columns) while gathering corresponding sense signals (e.g., in columns or rows). The touch sensor control circuitry may be used to determine the location or locations where a user's finger or fingers or other external objects (e.g., a touch stylus, etc.) touch display 24. Control circuitry in device 10 may take suitable action based on user touch input.

In addition to gathering finger touch input from a user, the touch sensor of device 10 may be used in monitoring for the presence of patterned conductive material in case 12. With one illustrative configuration, portion 12F of cover 12 may include a patterned conductive layer. The patterned conductive layer may, as an example, include a unique pattern of metal strips (e.g., horizontal or vertical conductive strips of various predetermined widths that are spaced apart by gaps of various predetermined widths). A conductive layer may also be patterned to form openings of various sizes, shapes, and locations, to form conductive dots, rectangular patches of conductive material, staircase-shaped structures, and/or to form other patterned conductive layer structures. These patterns can be detected by the touch sensor of device 10 (e.g., the touch sensor can capture two-dimensional images of the conductive layer pattern). When the presence of the pattern is detected in the capacitance images collected by the touch sensor, device 10 can conclude that portion 12F of cover 12 has been folded on top of device 10 and cover 12 is in a closed position. When the pattern is not detected by the touch sensor, device 10 can conclude that cover 12 is in an open configuration. Device 10 is therefore able to monitor the state of cover 12 (e.g., without using cover magnets in some configurations).

To help avoid undesired false detection events, the sizes and shapes of the conductive elements that form the conductive pattern in case 12 may be selected to be distinct from common everyday items such as coins, keys, and other common metal objects. For example, coins are typically round and commonly have diameters of more than 12 mm and less than 40 mm. Accordingly, conductive elements such as metal circles having diameters between 12 and 40 mm can be avoided to avoid a situation in which a coin or other foreign object with a coin shape that is present on device 10 produces a capacitive reading in the touch sensor of device 10 that mistakenly appears correspond to cover 12. The conductive pattern may also be configured to contain elements (e.g., strip widths, gaps, etc.) that contain few or no redundancies. As an example, if the conductive pattern is formed from a set of N conductive strips of metal, the strip width of each of the N strips may differ from the strip widths of all other strips and the gaps separating adjacent strips may all have unique values. By configuring the conductive pattern to contain as many distinct shapes/sizes as practically possible within the limited area available on cover 12, the conductive pattern will be exhibit a reduced (e.g., minimal) redundancy. This can help enhance pattern detection accuracy by device 10.

Figure 2:
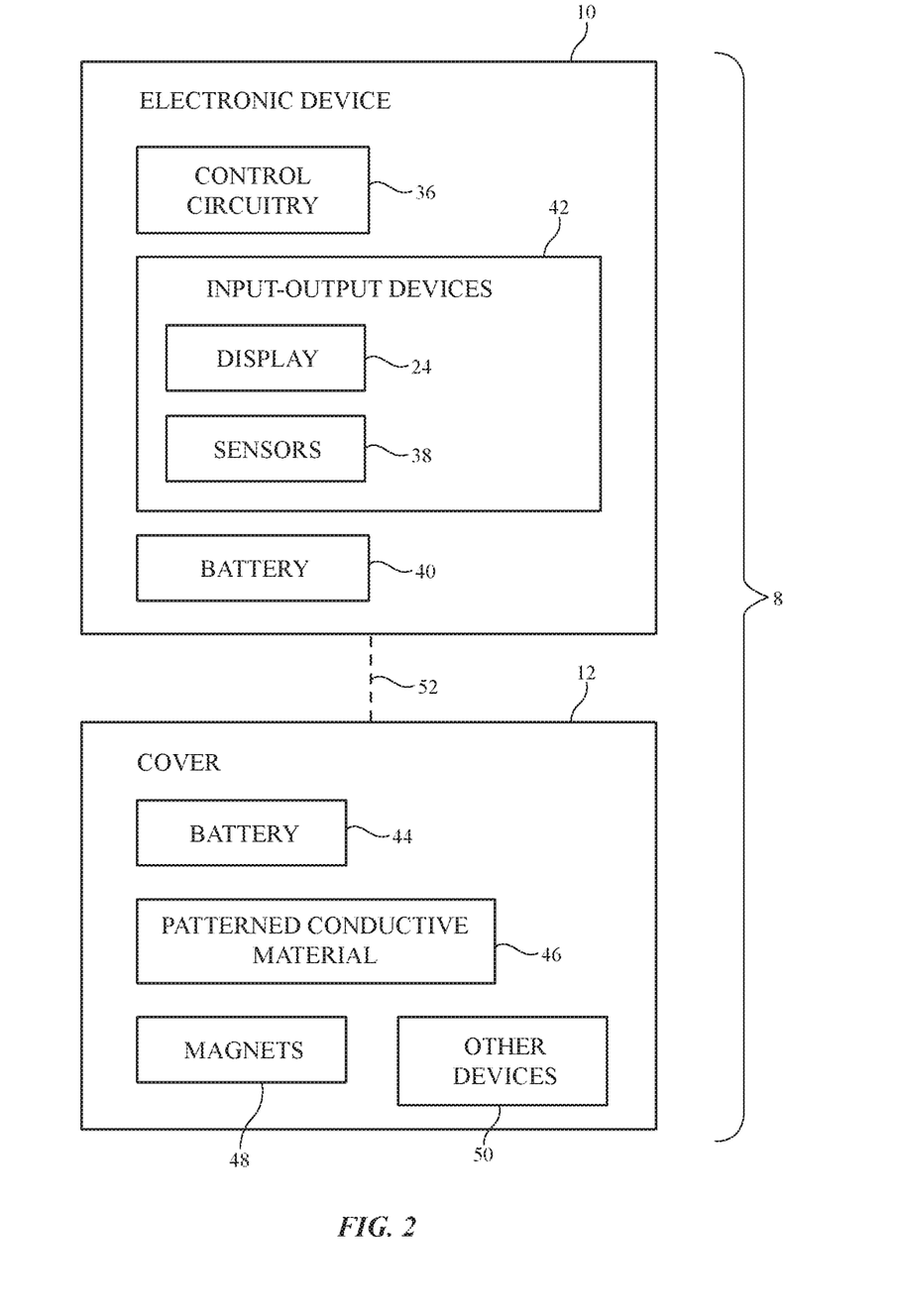
FIG. 2 is a schematic diagram of an illustrative electronic device and associated cover in accordance with an embodiment.

FIG. 2 is a schematic diagram of system 8. As shown in FIG. 2, electronic device 10 may have control circuitry 36. Control circuitry 36 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 36 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 42 may be used to allow data to be supplied to device 10 and to allow data to be provided from device 10 to external devices. Input-output devices 42 may include display 24 for displaying images to a user and other devices such as buttons, joysticks, scrolling wheels, touch pads, key pads, keyboards, microphones, speakers, tone generators, vibrators and other haptic output devices, light-emitting diodes and other status indicators, data ports, etc. Input-output devices 42 may also include sensors 38. Sensors 38 may include cameras (e.g., visible light and/or infrared image sensors), ambient light sensors, proximity sensors, orientation sensors, magnetic sensors (e.g., Hall effect sensors, magnetometers that serve as compasses, etc.), strain gauges and other force sensors, touch sensors (e.g., a capacitive touch sensor overlapping display 24), pressure sensors, fingerprint sensors, gas sensors, depth sensors such as structured light sensors, and other sensor circuitry. A user can control the operation of device 10 by supplying commands through input-output devices 42 and may receive status information and other output from device 10 using the output resources of input-output devices 42.

Control circuitry 36 may be used to run software on device 10 such as operating system code and applications. During operation of device 10, the software running on control circuitry 36 may capture and process touch sensor information gathered with the touch sensor formed from touch sensor electrodes 28 and may gather information from other sensors 38. Based on this information, control circuitry 36 may take suitable action, such as adjusting images displayed on display 24, adjusting the operation of sensors 38, placing circuitry in device 10 (e.g., circuitry 36) in a low-power sleep state to conserve power, waking circuitry that is in a sleep state, and/or other actions associated with controlling the operation of device 10.

Device 10 may receive wireless power from a wireless power transmitter and/or may receive wired power from a power adapter that is coupled to device 10 with a cable. Power that is received by device 10 may be used to charge battery 40. During portable operation, battery 40 may be used to power the circuitry of device 10. Battery power for powering device 10 may also be provided by a supplemental battery in cover 12 (e.g., optional battery 44). Cover 12 may have a connector that supplies battery power from battery 44 to device 10 (e.g., through a mating connector in device 10) and/or cover 12 may provide power to device 10 wirelessly. Cover 12 and device 10 may communicate via wired and/or wireless communications links (see, e.g., illustrative power and/or data link 52).

As described in connection with portion 12F of cover 12 in FIG. 1, cover 12 may include patterned conductive material 46 (e.g., a patterned conductive layer having a predetermined pattern that can be recognized in the capacitance images captured by device 10). Patterned material 46 may be incorporated into cover 12 in a location that allows the patterned material to be imaged (sensed) using the capacitive touch sensor of device 10. For example, patterned material 46 may be incorporated into front portion 12F of cover 12 of FIG. 1.

If desired, cover 12 may include one or more magnets 48 or other components that help device 10 detect the position of cover 12. For example, a magnet may be placed in a corner of front portion 12F so that this magnet aligns with a magnetic sensor in device 10 when cover 12 is closed. To conserve power, device 10 may initially determine whether cover 12 is opened or closed by monitoring the conductive pattern of material 46 with the touch sensor over display 24. In response to detecting the suspected presence of cover portion 12F, control circuitry 36 can activate the magnetic sensor of device 10 and use readings from the magnetic sensor to determine whether the magnet of portion 12F is present (e.g., adjacent to the magnetic sensor). In some configurations, device 10 may include and optical proximity sensor that can detect whether cover 12 is open (and not blocking the proximity sensor) or is closed (and blocking the proximity sensor). In this way, the touch sensor can be used to determine whether cover 12 is open or closed on a preliminary basis, whereas additional sensor circuitry such as the magnetic sensor or proximity sensor may be used to confirm the state of the cover when appropriate.

If desired, cover 12 may include additional devices 50 (e.g., additional components such as input-output devices 42 (e.g., a touch sensor for forming a touch pad or a touch sensor in a supplemental display), control circuitry (e.g., control circuitry such as control circuitry 36 of device 10), a display, force sensors and other sensors (e.g., sensors such as sensors 38 of device 10), status indicator lights, keyboard keys, buttons, and/or other input-output devices. Cover 12 may have a housing formed from polymer, metal, glass, ceramic, fabric, wood or other natural materials, other materials, and/or any combination of two or more of these materials. Control circuitry in cover 12 and/or device 10 may include wireless communications circuitry (e.g., radio-frequency transceiver circuitry and antenna(s)) and/or wired communications circuitry. Flexible printed circuits with metal traces and/or other layers of conductive material may be incorporated into cover 12 (e.g., for forming interconnect lines, for forming patterned conductive material 46, etc.).

Figure 3:
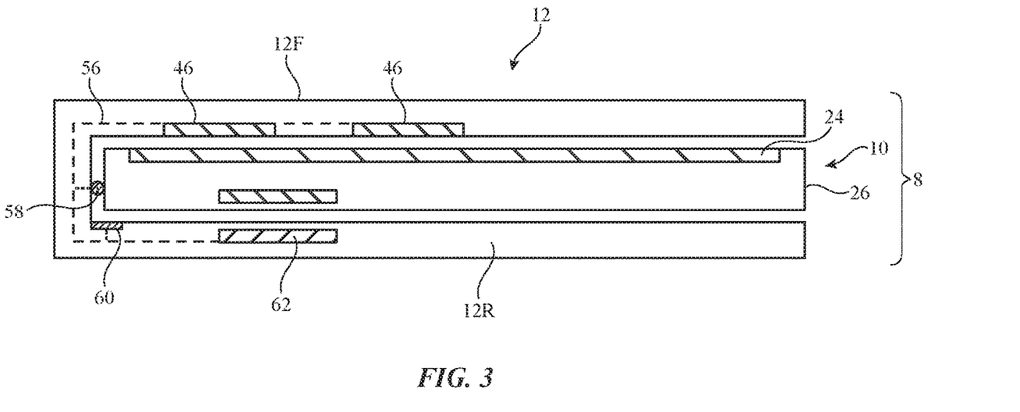
FIG. 3 is a cross-sectional side view of an illustrative electronic device and cover in accordance with an embodiment.

FIG. 3 is a cross-sectional side view of system 8 in an illustrative configuration in which cover 12 is closed so that front portion 12F covers display 24 on device 10. In this arrangement, device 10 is interposed between front portion 12F and rear portion 12R of cover 12. Cover 12 may have patterned conductive material 46. Conductive material 46 may be formed on portion 12F so that conductive material 46 is detectable by the touch sensor formed from touch sensor electrodes 28 on display 24. Conductive signal paths 56 may be formed from portions of material 46 and/or metal traces on flexible printed circuits, conductive strands of material (e.g., insulated wires and/or bare wires), metal foil, metal members (e.g., metal brackets), conductive adhesive (e.g., polymer that contains sufficient conductive filler to render the polymer conductive), and/or other conductive material.

The ability of the touch sensor of device 10 to detect the pattern formed from conductive material 46 may be enhanced by forming a grounding path between material 46 and the chassis (ground) of device 10. With one illustrative configuration, housing 26 includes a metal sidewall that is grounded in device 10. Path(s) 56 and conductive contact structure 58 (e.g., an electrical terminal such as a metal contact pad or other contact) can be formed in cover 12 so that path 56 (and thereby material 46) is shorted to the metal sidewall of housing 26 when device 10 is received within cover 12 as shown in FIG. 3. Grounding structures in cover 12 such as ground contact 60 (e.g., a pad, an elongated ring-shaped line or other elongated contact structures, etc.) may also be used to short (ohmically connect) conductive material 46 to a chassis ground formed from portions of a metal rear housing wall in housing 26 or other conductive structures in device 10.

In one illustrative configuration, conductive material 46 may be grounded to ground in device 10 using capacitive coupling. With this type of arrangement, paths 56 short conductive material 46 to capacitive coupling electrode 62 in rear portion 12R (as an example). Electrode 62 may be a rectangular metal pad or other conductive electrode structure that is in close proximity to conductive structures in device 10 (e.g., conductive housing 26 and/or capacitive coupling electrodes in device 10 such an illustrative electrode 64). Dielectric material in portion 12R may separate electrode 62 from the ground structures in device 10, but because electrode 62 is separated by a small distance from these structures (e.g., a distance of less than 5 mm, less than 2 mm, less than 1 mm, less than 0.5 mm, at least 0.01 mm, or other suitable distance), conductive material 46 will be effectively grounded to the ground structures in device 10 and capacitive touch sensor operation (e.g., capacitive sensor imaging of the pattern formed from material 46 overlapping display 24) may be enhanced.

Figure 4:
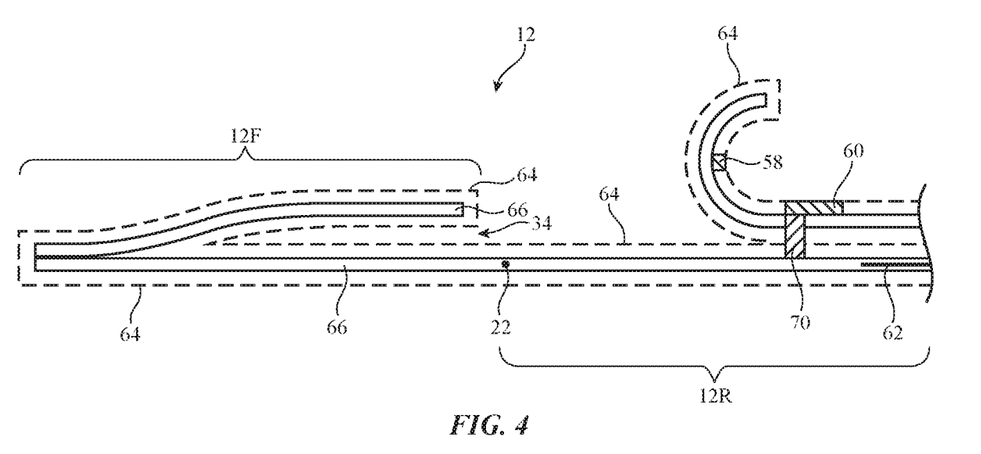
FIG. 4 is a cross-sectional side view of an illustrative cover in accordance with an embodiment.

FIG. 4 is a cross-sectional side view of a portion of cover 12. In the example of FIG. 4, outer covering layer(s) 64 overlap and cover inner layer(s) 66. Covering layer(s) 64 may be laminated to inner layer(s) 66 using heat and pressure and/or by attaching layer(s) 64 and layer(s) 66 using interposed layers of adhesive. Stiches (sewing), rivets, and/or other attachment mechanisms may also be used in forming cover 12 from materials such as covering layers 64 and inner layers 66.

Inner layer(s) 66 may be formed from a layer of conductive material such as material 46. In portion 12F, layers 66 may be patterned to form a recognizable pattern (patterned conductive material 46) for detection by the touch sensor in device 10. Some of layer 66 may also be used in forming signal paths 56. Contacts 58 and 60 may be formed using conductive vias such as via 70 that extend through covering layers 64 and/or other structures. One or more vias may also be used in coupling portions of layers inner layers 66 together. Vias may be formed from metal traces, sewn wire, and/or other conductive structures that penetrate vertically through one or more layers of cover 12. If desired, capacitive coupling electrodes 62 may be formed from conductive inner layer(s) 66. Layer(s) 66 may include metal traces on flexible printed circuits or other substrates, conductive strands of material (e.g., insulated wires and/or bare wires), metal foil, metal members (e.g., metal brackets), conductive adhesive (e.g., polymer that contains sufficient conductive filler to render the polymer conductive), and/or other conductive material (see, e.g., patterned material 46 in portion 12F of cover 12. Material 46 may be patterned using screen printing, pad printing, spraying, dipping, machining, etching, shadow masking, die cutting, laser patterning, and/or other patterning techniques.

Outer layer(s) 66 may be formed from polymer, metal, glass, ceramic, wood, leather, other natural materials, natural fibers (e.g., cotton), fabric, other materials, and/or combinations of these materials. For example, in portion 12F, a credit card pocket such a pocket 34 can be formed using layers 66 of leather, polymer, fabric, and/or other materials. The materials used in forming layers 66 and 64 may be sufficiently flexible to allow cover 12 to bend about one or more bend (fold) axes such as illustrative bend axis 22 (e.g., portions of cover 12 may be sufficiently flexible to form hinge structures). Hinges may also be formed from interlocking polymer or metal members (as examples).

Figure 5:
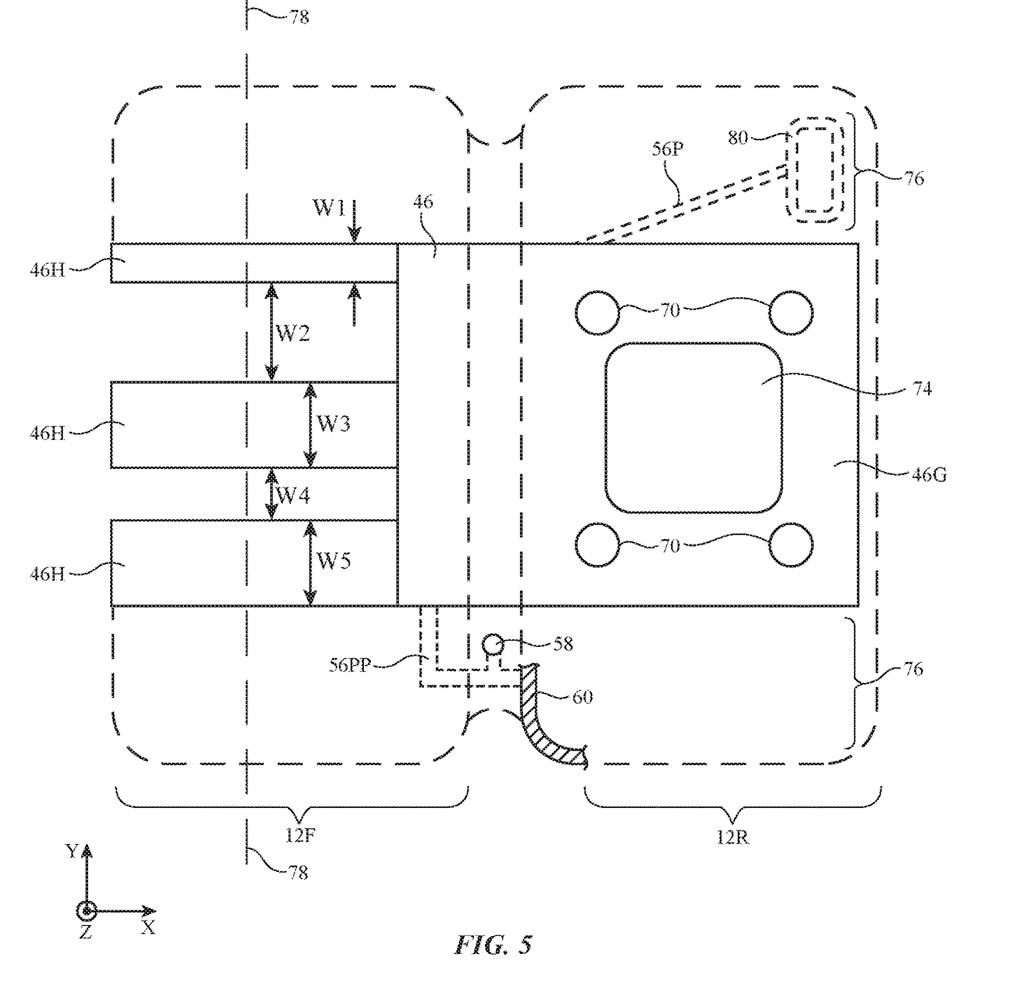
FIG. 5 is a top view of an illustrative cover with an illustrative patterned conductive layer in accordance with an embodiment.

FIG. 5 is a top view of cover 12 showing how patterned conductive material 46 (e.g., conductive material in layer(s) 66 of FIG. may have elongated portions such as horizontal strips 46H. Strips 46H may have different respective widths W1, W3, and W5 and may be separated by gaps of different respective widths W2 and W4, thereby providing strips 46H with a readily detected predetermined pattern. Strips 46H may extend horizontally across portion 12F of cover 12 (e.g., parallel to the X axis of FIG. 5). This may facilitate image recognition operations (e.g., when capturing capacitive sensor data with the touch sensor of device 10 along a line such as line 78 that extends vertically parallel to the Y axis and orthogonal to the horizontal longitudinal axes of elongated strips 46H). The spacing and strip widths may be selected to reduce (e.g., to help minimize) redundancy and thereby enhance detection accuracy. For example, the edges of strips 46H may be located in positions that are not integer multiples of each other, a pattern may be used which has distances between element edges that includes a minimum number of integer multiples of the smallest distance, and/or a pattern may be used in which edge distances have a minimum number of redundant spacings. By incorporating features such as these, patterned conductive material 46 may be configured to help enhance (e.g., maximize) the recognizability of the pattern formed in material 46 by control circuitry 36.

Control circuitry 36 can process the capacitive sensor data (capacitance images) gathered from the touch sensor in device 10 using any suitable technique. Circuitry 36 may, for example, capture full two-dimensional capacitance images and can process these images using image recognition (pattern recognition) techniques to identify predetermined patterns in material 46. Capacitance image data can also be gathered for a subset of the electrodes 28 in the touch sensor to help enhance processing speed and/or reduce power consumption. As an example, capacitance measurement may be made only for odd columns of the touch sensor, only for the left or right half of the touch sensor array, etc. The frequency with which touch sensor data is gathered may also be adjusted. For example, during normal operation gathering touch sensor input from the fingers of a user, the touch sensor of device 10 may be scanned at a frequency of 120 Hz, whereas during scanning operations to detect cover portion 12F, the touch sensor of device 10 may be scanned at a lower frequency (e.g., 4-20 Hz, 1-60 Hz, at least 3 Hz., at least 6 Hz, at least 12 Hz, less than 30 Hz, or less than 18 Hz).

Portion 46G of material 46 may extend into region 12R (e.g., to facilitate capacitive coupling to ground in device 10 and/or to facilitated forming ohmic contact with ground in device 10 using contacts 58 and/or 60 of FIG. 3). Vias 70 may be used in forming electrical connections with other conductive layers (e.g., contacts, capacitive coupling electrodes, etc.). If desired, material 46 may form a grounding path such as path 56P that electrically connects strips 46H to metal device structures in device 10 such as metal camera trim 80 (e.g., a grounded metal trim). Conductive paths such as path 56PP may be used to electrically connect strips 46H to contacts such as contacts 52 and/or 60. Portion 46G may have an opening such as opening 74 that overlaps an inductive charging coil in device 10 and thereby allows device 10 to receive wireless power when device 10 is in cover 12. Areas 76 of cover 12 may be free of conductive material so that overlapped antennas in device 10 are not adversely affected.

Each cover 12 (or each batch of covers 12) may have an associated code formed by the pattern of strips 46H in portion 12F (e.g., the number of strips, strip widths, gaps widths, strip shapes, strip orientations, etc.). There may be 1-10 strips 46H, at least 2 strips 46H, at least 3 strips 46H, fewer than 10 strips 46H, and/or other suitable number of strips 46H. Strip and gap widths may be at least 1 mm, at least 3 mm, at least 8 mm, at least 15 mm, at least 20 mm, less than 100 mm, less than 50 mm, less than 30 mm, or other suitable size.

Patterns of strips 46H or other patterns formed in one or more layers of conductive material 46 may, if desired, be used to identify covers by their type. For example, covers 12 that share one or more features such as color, case material (e.g., the material of layers 64), color, style, hardware capabilities, model number, model series, and/or other cover features may be labeled using the same coded pattern of strips 46H, thereby providing device 10 with this cover type information when cover 12 is placed on device 10. In general, any suitable information can be encoded in a patterned layer of conductive material 46.

Figure 6:
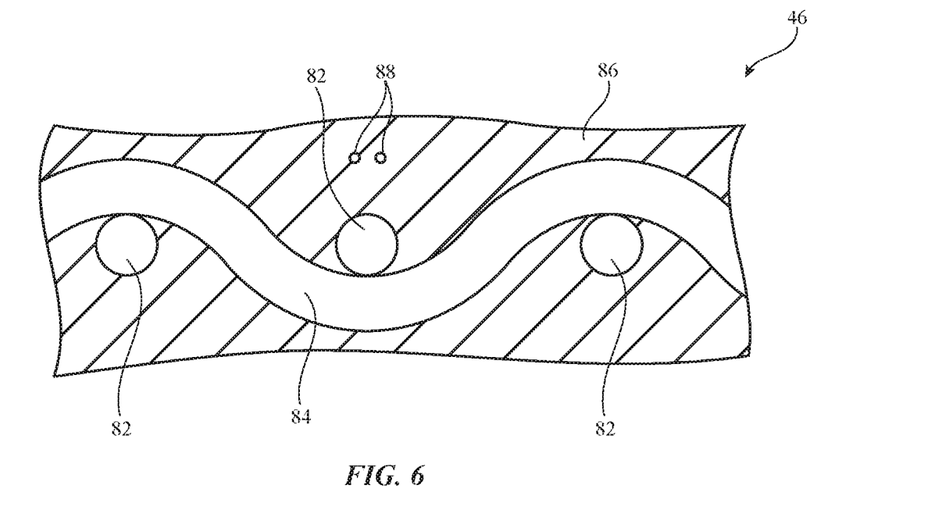
FIG. 6 is a cross-sectional side view of illustrative conductive material that optionally includes fabric in accordance with an embodiment.

One or more layers of conductive material 46 may be patterned to form a desired spatially encoded conductive pattern for cover 12 (e.g., for cover portion 12F). Conductive material 46 may be formed from any suitable conductive structures. A side view of conductive material 46 in an illustrative configuration in which material 46 includes a layer of fabric is shown in FIG. 6. The fabric layer of FIG. 6 may be a braided fabric layer, a knit fabric layer, a woven fabric layer having strands of material such as warp strands 82 and weft strands 84, and/or other suitable fabric. The fabric may be formed from conductive strands of material and/or dielectric strands of material. The conductive strands may form a desired pattern of conductive material 46 and/or additional conductive material can be used to coat the fabric.

As shown in FIG. 6, for example, polymer 86 may include conductive filler 88 (e.g., metal particles, carbon fibers, etc.) that renders the coating formed from polymer 86 conductive. Conductive polymer (e.g., conductive pressure sensitive adhesive and/or other conductive adhesive, conductive ink, conductive paint, etc.) may be formed on one or both sides of a fabric layer and/or may be used in coating individual strands of material in a fabric layer. Screen printing, etching, and/or other patterning techniques may be used in patterning material 46. Configurations for material 46 in which fabric is omitted may also be used. For example, a layer of patterned conductive material 46 may be formed by patterning metal traces on a flexible printed circuit substrate or other substrate, may be formed by cutting metal foil into a desired pattern, may be formed exclusively or primarily from conductive polymer, may be formed by depositing conductive polymer, metal, and/or other conductive coating layers onto leather, rigid enclosure structures, and/or other substrates, may be formed from stainless steel housing members or other rigid conductive structures that form interior and/or exterior portions of cover portion 12F, etc.

Figure 7:
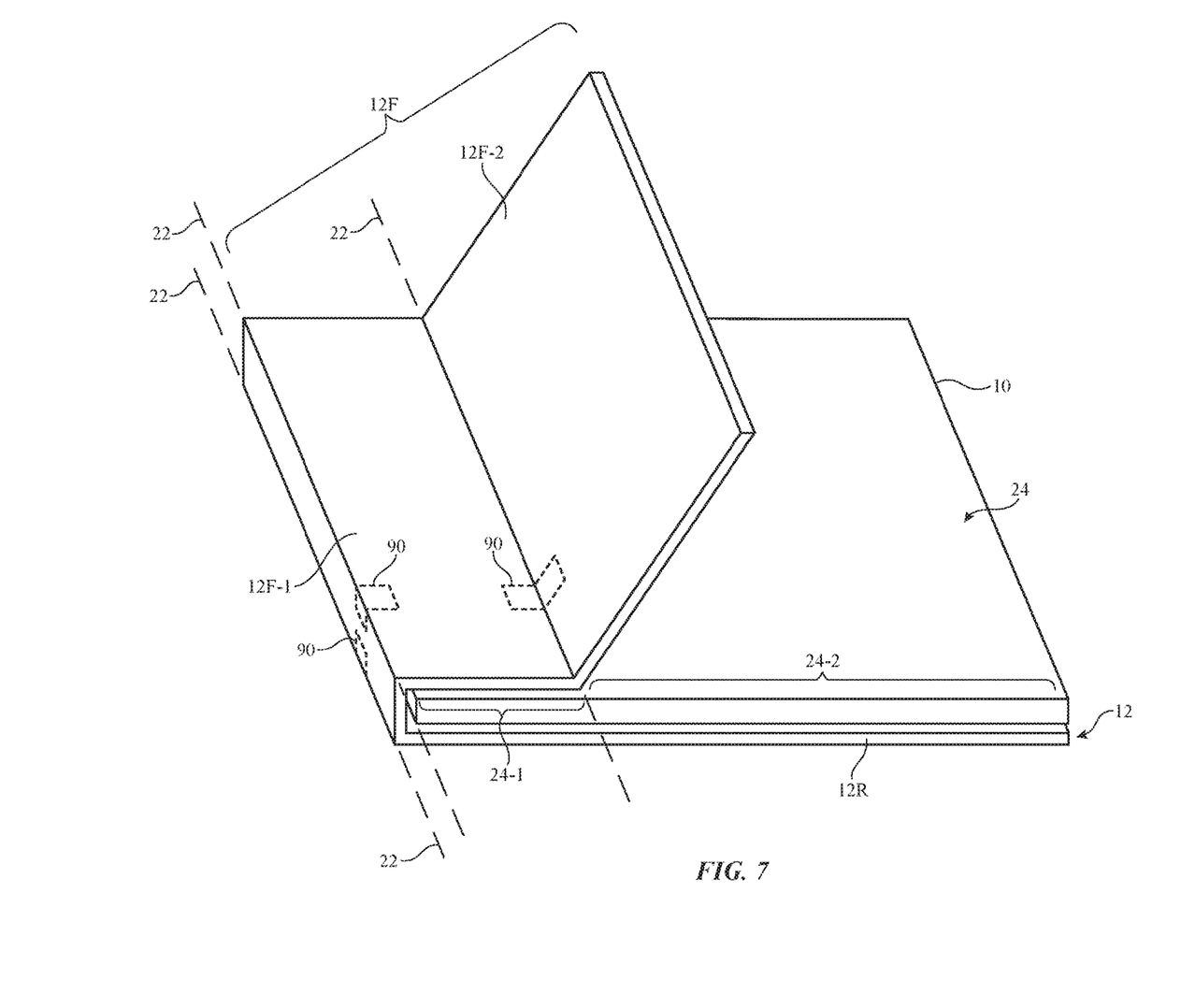
FIG. 7 is a perspective view of an illustrative cover and electronic device in accordance with an embodiment.

FIG. 7 shows how cover 12 may include bend sensors 90. Bend sensors 90 may be formed at portions of cover 12 that bend about bend axes 22. Sensors 90 may be formed from strain gauges or other force sensors and/or may include other sensor circuitry that senses when portions of cover 12 bend (fold). Signal paths in cover 12 may couple sensors 90 to control circuitry 36 in device 10 and/or control circuitry 36 in device 10 may gather information from sensors 90 using control and communications circuitry in cover 12. Control and communications circuitry in cover 12 can communicate sensor information from sensors 90 and/or other circuitry in cover 12 to device 10 using any suitable technique (e.g., wireless communications, communications through a connector that is physically and/or capacitively coupled to a corresponding connector in device 10, etc.).

During operation of system 8, device 10 and/or cover 12 may take actions based on bend sensor information. For example, the functionality of cover 12 and/or device 10 can be altered based on measurements from bend sensors 90 that are indicative of the state (e.g., the bending state) of cover 12. As an example, device 10 may deactivate portion 24-1 of display 24 to conserve power while activating portion 24-2 of display 24 to display information and receive touch input from a user in response to detection with bend sensors 90 that portion 12F-2 of cover portion 12F has been bend away from display 24 (e.g., by bending relative to portion 12F-1 of cover portion 12F as shown in FIG. 7). Sleep and wake states can also be adjusted based on bend sensor information. In some configurations, display modifications (e.g., selectively turning off portions of display 24) can be performed based on capacitance images (e.g., images that contain part of a patterned conductive layer).

Figure 8:
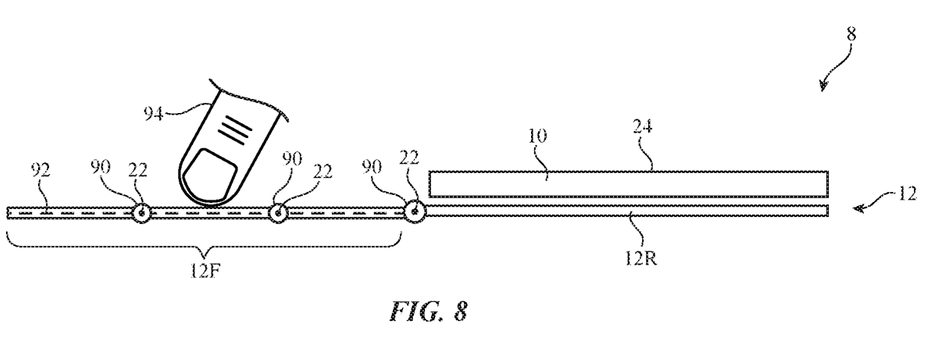
FIG. 8 is a cross-sectional side view of an illustrative cover and electronic device in an open configuration in which a touch sensor on an interior surface of the cover is gathering touch input in accordance with an embodiment.
Figure 9:
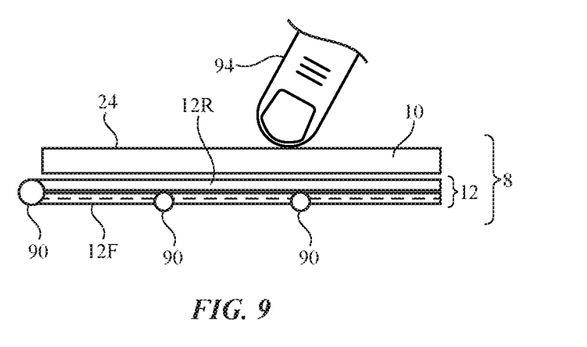
FIG. 9 is cross-sectional side view of the illustrative cover of FIG. 8 in a closed configuration in accordance with an embodiment.

In the example of FIG. 8, information from sensors 90 indicates that portion 12F of cover 12 is lying flat on a surface with cover portion 12R (e.g., portions 12F and 12R lie in a common plane so that cover 12 is open and flat). In response, control circuitry in device 10 and/or cover 12 activates user input components on portion 12F and gathers user input to help in controlling device 10. For example, portion 12F may have a cover touch sensor formed from an array of cover capacitive touch sensor electrodes 92 that can be used to gather cover touch input from user finger 94 or other external objects. This touch input may be supplied to device 10 and used by device 10 as additional touch input (e.g., input in addition to the touch input gathered from the touch sensor of display 24). When bend sensors 90 of cover 12 of FIG. 8 detect that cover portion 12F is being folded under portion 12R of cover 12 as shown in FIG. 9, the capacitive touch sensor in portion 12F can be deactivated to avoid undesired touch input.

Figure 10:
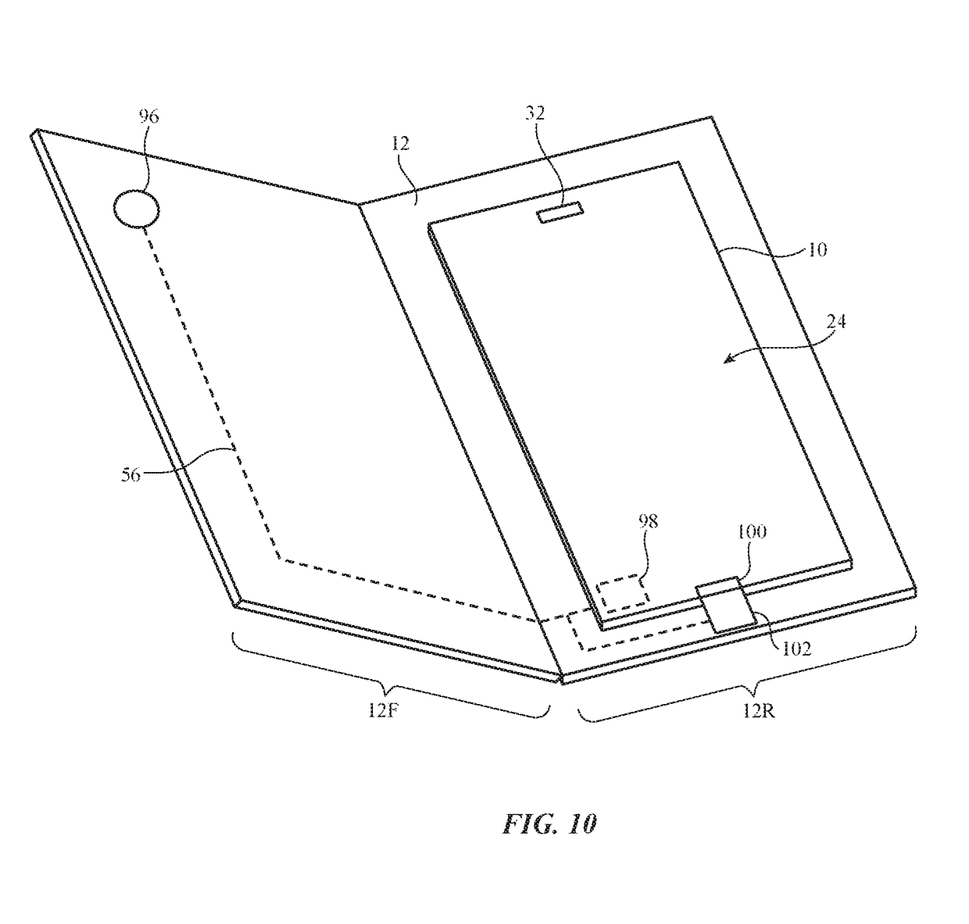
FIG. 10 is a perspective view of an illustrative cover with a supplemental component and an associated electronic device in the cover in accordance with an embodiment.

FIG. 10 shows how cover 12 (e.g., cover portion 12F) may have supplemental input devices (e.g., sensors and other devices 50 of FIG. 2). In the example of FIG. 10, device 10 has been received within portion 12R of cover 12. Device 10 may have a data port with a connector such as connector 100 that mates with a corresponding connector 102 in cover 12. If desired, cover 12 may also include electrodes such as electrode 98 that form ohmic connections with conductive housing structures, that capacitively couple to mating electrodes in device 10, and/or that otherwise facilitate the formation of capacitive sensor grounding connections and/or communications paths between the circuitry of cover 12 and the circuitry of device 10. Signal paths such as signal paths 56 may couple components in cover 12 such as illustrative component 96 to the circuitry of device 10 through connector 102, electrode(s) 98, and/or other communications paths. Component 96 may be a button, keyboard, touch sensor, light sensor and/or other input device. Configurations in which components such as component 96 serve as output devices (e.g., light sources, speakers, etc.) may also be used.

Figure 11:
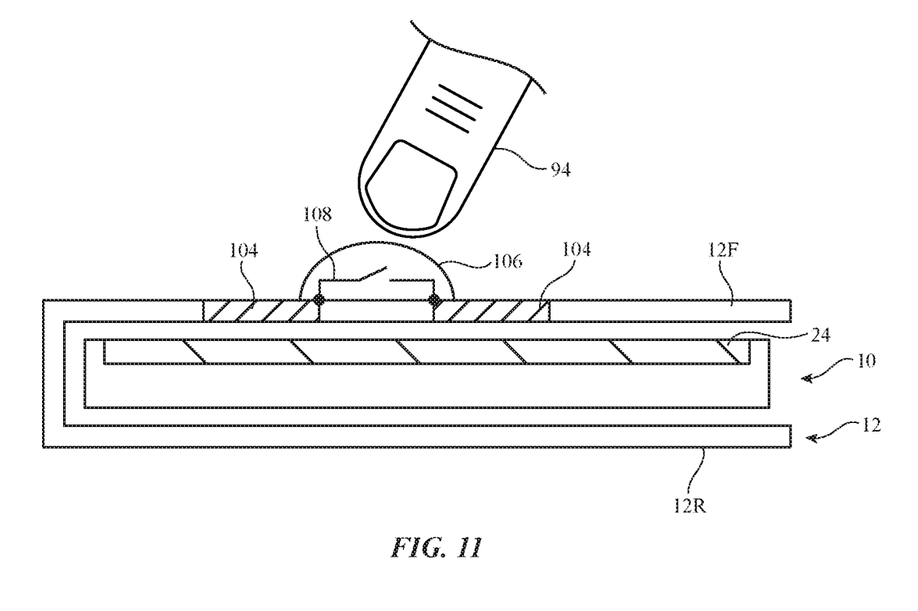
FIG. 11 is a cross-sectional side view of an illustrative cover with an external button in accordance with an embodiment.

If desired, input from a component in cover 12 may be supplied to device 10 using the touch sensor of display 24. Consider, as an example, the arrangement of FIG. 11. As shown in FIG. 11, device 10 may be mounted in cover 12 so that cover portion 12F overlaps display 24. Cover portion 12F may include electrodes such as electrodes 104. Electrodes 104 may include floating electrode(s) and/or electrode(s) 104 that are shorted to ground in device 10 using paths

56. Button 106 may have a dome switch or other switch 108 that is closed when a user's finger 94 presses button 106. This shorts electrodes 104 together and/or selectively couples one or more electrodes 104 to ground to change the pattern of capacitances measured using the capacitive touch sensor of display 24 (e.g., electrodes 28 of FIG. 1). Device 10 can then take suitable action based on this measured change (e.g., control circuitry 36 can conclude from the change in measured capacitance that button 108 has been pressed). If desired, button 106 or other components may alter current flow through electrodes 104 to produce a magnetic field (e.g., by shorting a conductive line formed from one or more electrodes 104 to a power supply path) and/or can make other changes to the electromagnetic properties of cover 12 that are detected by a magnetic sensor (e.g., a compass sensors) in device 10. By monitoring the magnetic field present at the compass, device 10 can determine whether the user is pressing button 106 and/or otherwise activating a supplemental input device on cover 12 that affects the magnetic field.

Figure 12:
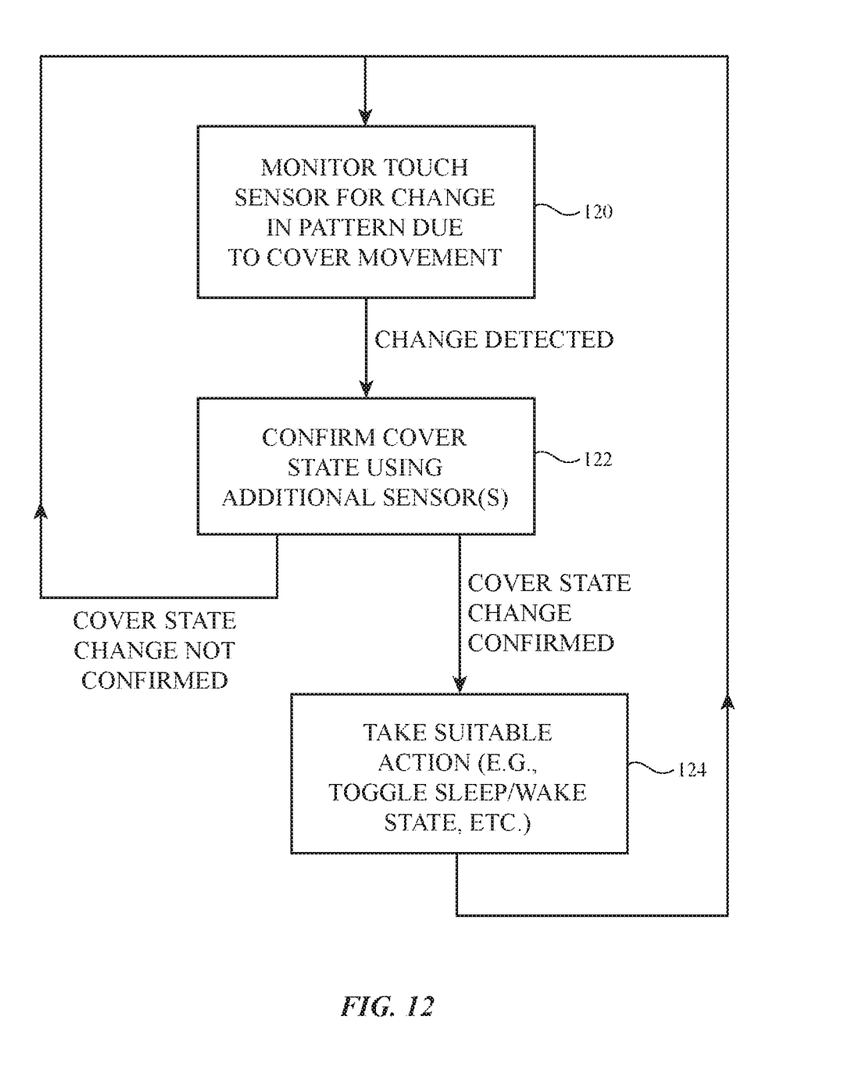
FIG. 12 is a flow chart of illustrative steps involved in using an electronic device and cover in accordance with an embodiment.

FIG. 12 is a flow chart of illustrative operations involved in using system 8 to detect the presence of cover portion 12F.

During the operations of block 120, device 10 may the capacitive touch sensor of display 24 to gather touch sensor measurements (e.g., capacitance images formed using data from multiple touch sensor electrodes, sometimes referred to as capacitive touch sensor images). A lower-than-normal scan frequency may be used in gathering touch sensor data to conserve power. If cover 12 is in an open state, portion 12F will not overlap display 24 and device 10 will not detect the presence of the patterned layer of conductive material 46. If cover 12 is in a closed state, however, portion 12F and the layer of patterned conductive material 46 of portion 12F will overlap display 24 and will be detected by device 10.

Device 10 can identify a coded pattern that is embedded in the patterning of material 46 and can use this identification to determine when cover 12F is present rather than the user's fingers or other objects. For example, control circuitry 36 can determine whether cover 12 has been opened (transitioning from closed to open) by detecting from the capacitance images that the patterned conductive layer that was previously present in the capacitance images has become absent from the capacitance images. Likewise, control circuitry 36 can detect when cover 12 has been closed (transitioning from a cover open state to a cover closed state) by determining from the capacitance images that the previously absent patterned conductive layer has become present in the capacitance images.

Device 10 can take suitable action based on detected changes in the state of cover 12 (e.g., transitioning from open to closed or from closed to open). The capacitance images that are gathered during the cover state transition monitoring operations of block 120 can extend over the full two-dimensional extent of the touch sensor electrode array or can include subsets of the touch sensor electrodes (e.g., just odd numbered touch sensor electrode columns, only the first row of the touch sensor electrodes, the left or right or top or bottom half of the touch sensor area, other reduced portion of the maximum touch sensor electrode coverage area, etc.).

If desired, confirmation of the state of cover 12 (e.g., whether cover portion 12F is overlapping display 24) can be obtained using one or more additional sensors before device 10 takes action based on a suspected (capacitively detected) cover state change. For example, cover portion 12F may have a magnet and device 10 may have a magnetic sensor that can be activated during the operations of block 122 to detect whether the magnet is present and thereby confirm whether cover 12 is open or closed. Because the magnetic sensor need not be activated until device 10 strongly suspects that cover 12 has changed state, power consumption associated with continually operating the magnetic sensor may be reduced.

In some arrangements, other sensors can be used during the confirmation operations of block 122 in addition to or instead of a magnetic sensor. For example, the magnetic sensor and magnet need not be used in scenarios in which device 10 includes a proximity sensor such as an optical proximity sensor. This type of sensor may, for example, be located adjacent to speaker port 32 (e.g., under a display cover layer for display 24). The optical proximity sensor may include a light emitter such as an infrared light-emitting diode and a corresponding light detector such as an infrared photodiode. When objects are not located in the vicinity of the proximity sensor, little emitted infrared light will be reflected back to the infrared photodiode and device 10 can conclude that cover portion 12F is not present. When cover 12F overlaps display 24, infrared light from the infrared light emitter will be detected by the infrared photodiode and device 10 can thereby confirm that cover 12F is present.

If the operations of block 122 do not confirm that the state of cover 12 has changed as initially suspected, cover state monitoring operations can continue at block 120. If, however, device 10 determines from one or more confirmatory sensor measurements at block 122 that the cover has changed state (e.g., been opened or closed by the user), processing can proceed to block 124.

During the operations of block 124, device 10 can take suitable action based on the detected change in the state of cover 12. For example, if cover 12 had previously been closed and device 10 was in a low-power sleep state, detection of the opening of cover 12 may be used to cause device 10 to enter a higher power normal (wake) state (e.g., a state in which display 24 can be used and a user may supply input to the touch sensor of display 24). If cover 12 has previously been open and device 10 was in a normal awake (wake) mode of operation, detection of the closing of cover 12 can direct device 10 to place its circuitry in a low power sleep state (e.g., a state in which control circuitry 36 and other circuitry in device 10 consume less power than normal and in which display 24 is off and the touch sensor of display 24 is inactive for gathering normal input, while still being used to gather low-frequency touch sensor data during the monitoring operations of block 120). If desired, the operations of block 124 may involve monitoring for input from circuitry on cover 12 (e.g., a touch sensor of the type described in connection with portion 12F of cover 12 in FIG. 8, a button of the type described in connection with button 106 of FIG. 11, a supplemental component such as supplemental component 96 of FIG. 10, bend sensors 90 of FIG. 7, etc.).

The foregoing is merely illustrative and various modifications can be made to the described embodiments. The foregoing embodiments may be implemented individually or in any combination.

What is claimed is:

1. An electronic device operable within a removable cover having at least first and second portions that move relative to each other, wherein the first portion includes a conductive layer having a predetermined conductive layer pattern, the electronic device comprising:
   a housing;
   a display in the housing that has a capacitive touch sensor;
   control circuitry configured to:

capture capacitance images with the touch sensor;

in response to detecting that the cover has been closed by detecting that the conductive layer pattern has become present in the capacitance images, taking a first action; and in response to detecting the cover has been opened by detecting that the conductive layer pattern has become absent from the capacitance images, taking a second action that is different than the first action.

2. The electronic device defined in claim 1 wherein the first action comprises placing the control circuitry in a sleep state and wherein the second action comprises placing the control circuitry in a wake state having a larger power consumption than the sleep state.

3. The electronic device defined in claim 2 further comprising:

an optical proximity sensor, wherein the control circuitry is configured to use information from the optical proximity sensor in determining whether to take the first and second actions.

4. The electronic device defined in claim 1 wherein the predetermined conductive layer pattern is configured to enhance the recognizability of the predetermined conductive layer pattern to the control circuitry.

5. A cover for an electronic device, comprising:

a conductive structure with a predetermined pattern configured to be detected in capacitance images gathered with a touch sensor in the electronic device; and a dielectric covering that overlaps the conductive structure.

6. The cover defined in claim 5 wherein the conductive structure comprises a layer of conductive polymer having the predetermined pattern, the cover further comprising a grounding path between the layer of conductive polymer and the electronic device.

7. The cover defined in claim 5 wherein the predetermined pattern of the conductive structure is configured to enhance the recognizability of the predetermined pattern to the touch sensor.

8. A cover for an electronic device having a display with a capacitive touch sensor, comprising:

a rear cover portion configured to receive the electronic device; and a front cover portion configured to move relative to the rear cover portion, wherein the front cover portion includes a layer of conductive material that has a predetermined pattern configured to be measured by the capacitive touch sensor when the front cover portion overlaps the display.

9. The cover defined in claim 8 wherein the front cover portion has a dielectric outer layer that covers the layer of conductive material and wherein the predetermined pattern comprises elongated strips of the layer of conductive material that extend across the display when the front cover portion overlaps the display.

10. The cover defined in claim 9 wherein the layer of conductive material comprises a layer of conductive polymer.

11. The cover defined in claim 10 wherein the dielectric outer layer comprises a polymer layer.

12. The cover defined in claim 10 wherein the dielectric outer layer comprises leather.

13. The cover defined in claim 10 wherein the dielectric outer layer comprises fabric.

14. The cover defined in claim 8 further comprising a bend sensor configured to measure relative rotation between the front and rear portions.

15. The cover defined in claim 8 further comprising a grounding path between the layer of conductive material and the electronic device.

16. The cover defined in claim 15 wherein the grounding path comprises an electrode that is configured to capacitively couple to the electronic device when the electronic device is received in the rear cover portion.

17. The cover defined in claim 15 wherein the grounding path comprises a terminal that is configured to ohmically contact the electronic device.

18. The cover defined in claim 8 further comprising a component on the front cover portion that is configured to communicate with the electronic device.

19. The cover defined in claim 18 wherein the component comprises a button coupled to electrode structures that are configured to be monitored by the capacitive touch sensor.

20. The cover defined in claim 8 further comprising a cover touch sensor configured to provide cover touch sensor input to the electronic device.

21. The cover defined in claim 20 further comprising a bend sensor, wherein the cover touch sensor is configured to gather the cover touch sensor input in response to detection, with the bend sensor, of a state in which the front cover portion and the rear cover portion lie in a common plane.

22. The cover defined in claim 21 wherein the cover touch sensor comprises capacitive touch sensor electrodes in the front cover portion.

\* \* \* \* \*